United States Patent [19]

Chow

[11] Patent Number: 4,520,453
[45] Date of Patent: May 28, 1985

[54] ADDRESS TRANSFORMATION SYSTEM HAVING AN ADDRESS SHUFFLER

[75] Inventor: Yechow T. Chow, Upper Estate Kowloon, Hong Kong

[73] Assignee: Ampex Corporation, Redwood City, Calif.

[21] Appl. No.: 438,290

[22] Filed: Nov. 1, 1982

[51] Int. Cl.³ .............................................. G06F 9/32
[52] U.S. Cl. ................................. 364/900; 365/200; 371/11
[58] Field of Search ... 364/200 MS File, 900 MS File; 370/92; 371/11; 365/200

[56] References Cited

U.S. PATENT DOCUMENTS

| | | | |
|---|---|---|---|
| 3,765,001 | 10/1973 | Beausoleil | 365/200 |
| 3,992,702 | 11/1976 | Bailey | 365/200 |
| 4,089,063 | 5/1978 | Takezono | 365/200 |
| 4,453,248 | 6/1984 | Ryan | 371/11 |

OTHER PUBLICATIONS

*Fault-tolerant paging store*-Ryan-IBM TDB, vol. 26, No. 6, Nov. 1983, pp. 2745-2746.

*Primary Examiner*—Harvey E. Springborn
*Attorney, Agent, or Firm*—Harry G. Thibault; Joel D. Talcott

[57] ABSTRACT

An address transformation system receives an input address and outputs in response thereto a data store address indicating an operable address location in an associated data store even if the received input address identifies a defective location in the associated data store. The address transformation system includes an address shuffler coupled to receive the input address and output a shuffled address and an address translator coupled to receive the received input address and the shuffled address and output the data store address in response thereto. Economic considerations dictate that the address translator be constructed in such a way that it is unable to accommodate all possible combinations of defective address locations in the associated data store by translating an address indicating a defective location to an address indicating an operable location. The address shuffler increases the utility of the address translator by representing an unaccommodatable set of input addresses as a set of shuffled address that can identify the defective data store address locations in a combination that can be accommodated by the address translator.

23 Claims, 7 Drawing Figures

FIG_2

FIG_3

FIG_6

FIG_4

FIG_5

FIG_7

ADDRESS TRANSFORMATION SYSTEM HAVING AN ADDRESS SHUFFLER

BACKGROUND OF THE INVENTION

1. Field of the Invention

This invention relates to address transformation systems and more particularly to such systems having an address translator with a translation address distribution limitation and an address shuffler coupled to generate shuffled addresses which avoid the distribution limitation.

2. Discussion of the Prior Art

Data storage devices have become increasingly larger in recent years in order to meet the demands of the data processing industry for ever more storage and in order to reduce manufacturing costs. However, as data store sizes increase it becomes increasingly difficult to produce defect free components. A single defect within a batch fabricated component such as a semiconductor memory chip may require the discarding of the entire component or at least a significant portion of the component. Other data storage components such as some types of core memories may be repairable, but at relatively high cost.

In order to avoid disposal of an expensive component because of a relatively small number of defects, address transformation systems have been developed which translate an input address for a defective data store location to a different, valid data store location. Upon manufacture of a data store component, the component is tested to identify defective storage locations. The address transformation system is then programmed to recognize the defective address locations and translate any such address to a different, valid address location. Except for possible time delay penalties under some arrangements, an external device using the data store is unaware that any address translation has taken place.

One example of such an address transformation system is disclosed in application Ser. No. 279,204, filed June 30, 1981 for "Selective Mapping System and Method" by Thomas J. Gilligan. Other systems are disclosed in U.S. Pat. Nos. 3,633,175 Harper and 4,310,901 to Harding et al.

Typically these address transformation systems partition incoming address signals into two or more ordered sets. One set can be said to select one of many pages and the other set can be said to identify a particular address on the selected page. If the number of defective locations associated with any single page exceeds a certain given number, the system fails. Usually an economic tradeoff must be made between the cost of the transformation system and the limitations on the number and distribution of defective addresses that can be accommodated.

For example, in the above-mentioned system of Thomas J. Gilligan, an address transformation system for a 512K word core memory can accommodate up to 4K defective address locations if they are properly distributed. However, there may be no more than 64 faults associated with any single page, whether an A page or a B page, and accommodating all defects becomes increasingly difficult as the maximum number of 4K defects is approached. It is estimated that with the maximum number of 4K randomly distributed defects, the probability of more than 64 defects occurring on any single addressing page is less than one in 100,000.

However, any memory system will tend to experience the occurrence on nonrandom defects. For example, a defective current line or in a core memory a noisy or defective sense winding may result in unsatisfactory operation at a large number of physically related data storage locations. Because economy of manufacture often requires address decoders to associate address pages with certain sense windings or control lines, a single defect may cause a large number of memory defects to occur on the same addressing page. This can cause an address translation system to fail even though the total number of data store faulty address locations is less than the maximum for the address translation system. The present invention shuffles the input addresses relative to the actual data store addresses in such a way that grouped data store defects will be distributed over multiple addressing pages so that an address translation system need not fail because of the nonrandom occurrence of multiple defects.

SUMMARY OF THE INVENTION

A data store address translation system in accordance with the invention avoids defective memory address locations. The system includes an address translator which partitions the digits of an input address into two or more parts. Each possible combination of the digits in each part indicates a page of data store address locations. For economical reasons the construction of the address translator requires that only a given maximum number of address locations indicated by any single page of data store addresses may be defective. The translation system further includes an address shuffler which provides in response to each input address a first set address from a first set of addresses and a shuffled second set address from a second set of addresses which avoids the maximum defects per page limitation.

The address shuffler is coupled to receive a multi-digit input address represented by a plurality of input address signals from a set of input addresses and in response thereto to generate a first set address which is within a first set of addresses, and a second set address which is within a second set of addresses with each address in each of the first and second sets having a unique correspondence and a selected relationship to an input address and to an address within the other of the first and second sets, the addresses of the second set being partitioned into different first and second parts defining respectively a first set of pages and a second set of pages of addresses such that within the associated data store a number of defective data store address locations defined by addresses in the first set of addresses corresponding to addresses within any single page of the first set of pages is no greater than the given maximum number of addresses that can be accommodated by the address translator.

The address translator is coupled to receive from the address shuffler the first set address and the shuffled second set address and to output a store address in response thereto, the output store address being the received first set address in response to an absence of a fault signal and a translated address outside the first set of addresses in response to a presence of the fault signal. The address translator includes a fault detector responsive to a provided shuffled second set address and is coupled to generate the fault signal when a provided shuffled second set address corresponds to an address within a predetermined subset of the second set addresses having corresponding first set addresses which define a defective storage location within the associated data store.

In a specific embodiment, the address shuffler may comprise a switch mechanism which generates a shuffled second set address from the second set of addresses by interchanging the order of signal conductors in an ordered set of signal conductors representing the received input address. In another embodiment, the signal conductors representing a received input address may be partitioned into first and second groups with the first group being passed through to generate a first group of signal conductors representing a first part of a second set address. An adder is connected to generate a signal on each conductor of a group of signal conductors representing a second part of the second set address by indicating a sum of partial addresses defined by the first and second groups of signal conductors. In still another embodiment the first group of signal conductors representing the first part of the second set address is generated by a second adder as the sum of values represented by the first group of signal conductors representing a received input address signal and the second group of signal conductors representing the second group of second set address signals. This is equivalent to the sum of the second group and twice the first group $(BS = Bi + Ai)$ $(AS = Bi + 2Ai)$.

BRIEF DESCRIPTION OF THE DRAWINGS

A better understanding of the invention may be had from a consideration of the following detailed description taken in conjunction with the accompanying drawings in which.

DETAILED DESCRIPTION

Figure 1:
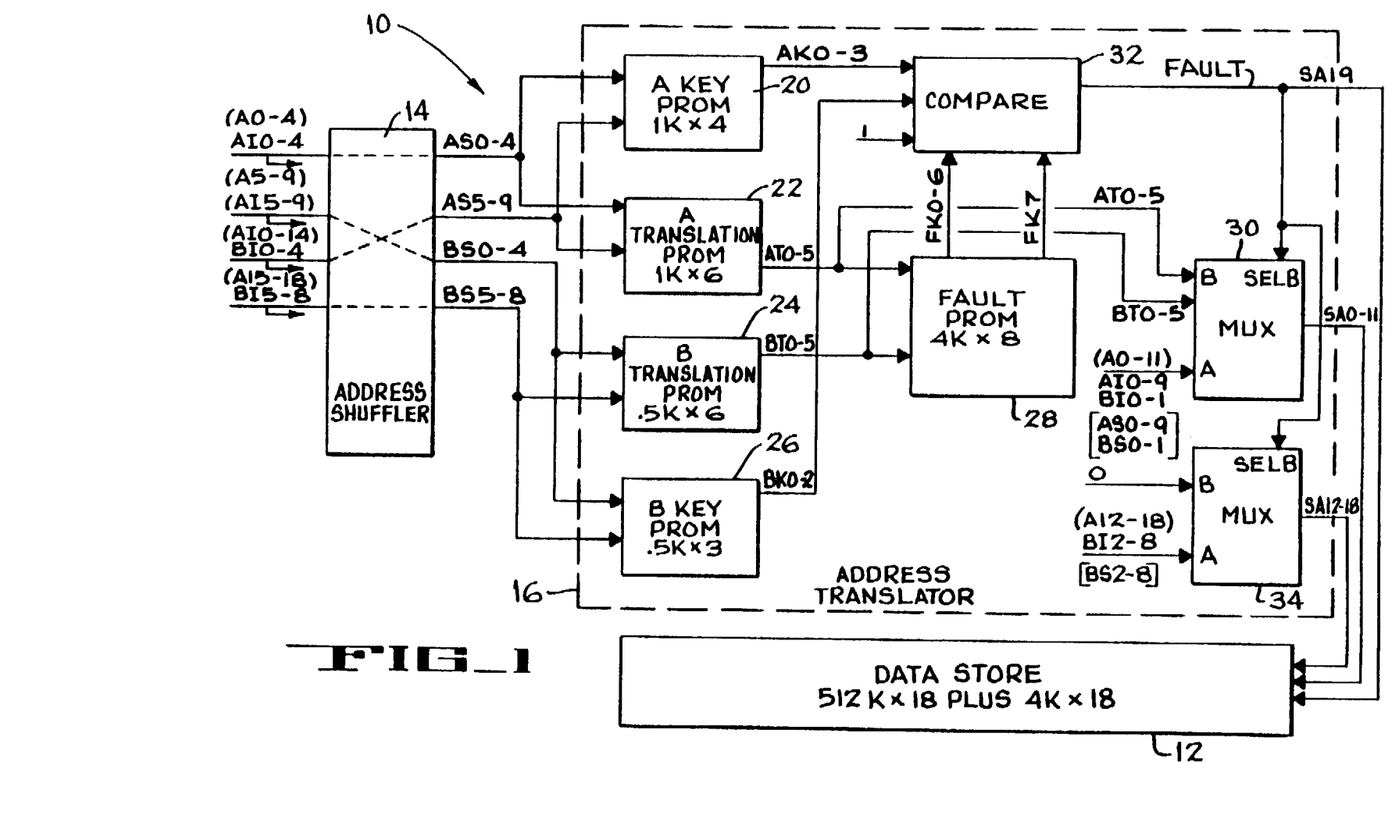
FIG. 1 is a block diagram and schematic representation of an address translation system in accordance with the invention.

Referring now to FIG. 1, an address translation system 10 in accordance with the invention is coupled between a suitable source of input addresses A0-18 such as a memory address register (not shown) and a data store 12. The address translation system 10 includes an address shuffler 14 and an address translator 16.

The address shuffler 14 receives multi-digit input addresses represented by 19 input address signals, each representing a different one of the binary input address digits A0-18. The input addresses are passed to the address translator 16 as a first set of addresses. Address shuffler 14 also shuffles the input addresses to produce a second set of multi-digit shuffled addresses represented by a plurality of shuffled address signals having first and second multi-digit portions designated AS0-9, and BS0-8. Signals representing the digits of the first and second set addresses are coupled to address translator 16.

The 512K main storage portion of data store 12 requires a 19 bit binary address to select a single word location therein. A 20th bit selects the 512K main portion when logic 0 and the 4K portion when at logic 1. Because the address translation system 10 is transparent to a data processing system using the data store 12, the input address signals A0-18 contain only 19 bits of addressing to select one of 512K words. The 20th bit which selects either the main memory portion or the auxiliary portion when an address is to be translated, is generated by address translator 16.

The 19 bit input address signal appears on 19 parallel conductors which may be ordered and assigned binary weights so that each input address may be considered to be a 19 bit binary number which uniquely identifies an address location within data store 12. The higher numbered address bits are considered to be the more significant. With the input address conductors and corresponding signals carried thereby ordered and binary weighted, a change in the order and corresponding weighting results in a shuffling of the input address. Address shuffler 14 in effect provides a switching function which switches the relative order of the address bits to produce the second set of addresses in response to the input first set of addresses. Address shuffler 14 partitions the signals representing digits of the input addresses into four groups. Group one is designated AI0-4 and includes address bits A0-4. Group two is designated AI5-9 and includes address bits A5-9. Group three is designated BI0-4 and includes input address bits AI0-14. Group four is designated BI5-8 and includes address bits AI5-18. Address shuffler 14 shuffles the input addresses by interchanging the relative order of the second and third groups designated AI5-9 and BI0-4. That is, the second set of addresses is partitioned into four groups of ordered address signals with a first group designated AS0-4 corresponding to input addresses A0-4, a second group designated AS5-9 corresponding to input addresses AI0-14, a third group designated BS0-4 corresponding to input addresses A5-9, and a fourth group designated BS5-8 corresponding to input addresses AI5-18.

The first and second groups of digits defining the second set addresses are combined to form an ordered weighted set of partial addresses indicating an A page of addresses and the third and fourth groups of digits defining the second set addresses are combined to provide an ordered weighted set of partial addresses indicating a B page of addresses.

The A page partial address signals designated AS0-9 are coupled to address an A key prom 20 which responds by outputting four A key bits designated AK-0-3. The A page partial address signals are also communicated to an A translation prom 22 which responds by generating a 6 bit translation address designated AT0-5. Similarly, the third and fourth groups of digits defining the second set of addresses are designated BS0-4 and BS5-8 and are combined in a binary weighted order to generate a second or B page partial address of 9 bits which is communicated to a B translation prom 24 and a B key prom 26. B translation prom 24 responds by generating a 6 bit translation address output and B key prom 26 responds by generating a 3 bit B key prom output. The A translation bits AT0-5 and B translation bits BT0-5 are combined in a binary weighted order to form a 12 bit translation address which is communicated to a 4K by 8 fault prom 28 and also to an address multiplexer 30.

Fault prom 28 stores predetermined binary codes at addressed word locations. At each word location 7 bits are selected to equate to the 7 key bits AK0-3 and BK0-2 and an eighth bit is set to 1 to indicate that the addressed location is active. That is, the location relates to an address within the auxiliary 4K portion of data store 12 which is to be addressed whenever a certain defective location within the main portion of data store 12 is defined by the input address A0-18. A comparator 32 compares the 7 bits generated by fault prom 28 with the 7 key bits and the eighth bit FK7 generated by fault prom 28 with logic 1. If the comparison indicates complete equality, a logic 1 fault signal is generated by compare circuit 32. This fault signal becomes the 20th address bit for data store 12 designated SA19. The fault signal is also coupled to the select B inputs of multiplexer 30 and a second multiplexer 34. Multiplexer 30 is a 12 bit two to one multiplexer having input address signals from the first set designated A0-11 coupled to the A input and the 12 translated address bits designated AT0-5 and BT0-5 coupled to the B input. The 12 bit ouput of multiplexer 30 generates the 12 least significant data store address signals designated SA0-11. These least significant address bits designate one of 4K address locations within the auxiliary portion of data store 12 when the fault signal is true or alternatively when the fault signal is false, one of 4K locations within the main portion of this data store from a group of 4K locations which is designated by data store address bits SA12-18. Data store address bits SA12-18 are generated by multiplexer 34 which has logic 0 connected to its B input and input address bits A12-18 connected to the A input. Consequently, in the event of the occurrence of the fault signal, address bits SA12-18 are constrained to 0 while in the absence of a fault signal, input address bits A12-18 are communicated to data store 12 as the address bits SA12-18. A more complete description of address translator 16 can be found in, application Ser. No. 279,204 filed June 30, 1981 by Thomas J. Gilligan entitled "Selective Mapping System and Method".

As an example of the operation of the address translation system 10, assume that the data store 12 is a core memory having for the main portion of the data store 4K work lines with 128 words times 18 bits per word equal 2304 bit lines crossing each word line. That is, each work line partially selects 128 words with 18 bits in each word. If it is assumed by way of example that one of the word lines is defective, then the 128 words which are partially selected by the defective word line will all represent defective storage locations. This is far less than the 4K maximum capacity of the address translator 16. However, let it be further assumed that the word lines are selected by a predetermined group of bits within the store address, for example bits SA0-11. Let it be further assumed that the defective word line is word line 928, as an arbitrary example.

Figure 2:
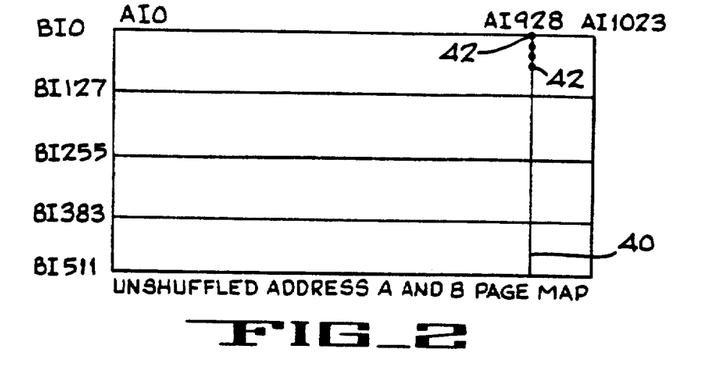
FIG. 2 is an unshuffled address page map that is useful in understanding the invention.

The address translator 16 operates in a paging mode and partitions the incoming address signals into an A group of digit signals and a B group of digit signals which can be set to define an A page of address and a B page of addresses respectively. Since together an A page partial address and a B page partial address uniquely identify an address location, the A and B partial address portions can be conceptualized as orthogonal lines on an address map as shown in FIG. 2. Where the A page partial addresses have numbers which increase along the horizontal axis and are represented as vertically extending lines and the B page partial addresses have numbers which increase along the vertical axis and are represented as horizontally extending lines. Because 12 bits are required to select one of 4K data store word lines, and only 10 bits are utilized to define the A portion of the translator 16 partitioned address, four physical data store 12 word lines map into each vertically extending AI mapping line as shown in FIG. 2. These four word lines are distinguished by the two least significant B page address bits BI0, 1. For example, partitioned mapping address AI 928 which is shown as vertical line 40 in FIG. 2 actually corresponds to the four physical word lines 0+928=928, 1K+928=1952, 2K+928=2976 and 3K+928=4000. In the present example only the single word line 928 is actually defective. In the page map of FIG. 2 the 128 words along physical word line 928 map into every fourth bit along AI mapping line 928 where B group bits BI1, 0=0, 0 as illustratively represented by points 42. Bits BI2-8 select one of 128 words along physical word line 928.

However, one of the conditions imposed by address translator 16 (because there are 6 bits from the B translate PROM to enumerate the faults) is that no more than 64 faulty address word locations occur along any single A group mapping line or any single B group mapping line. Assuming no other faults, the requirement fails in the present example because 128 faults occur along mapping line AI928.

Figure 3:
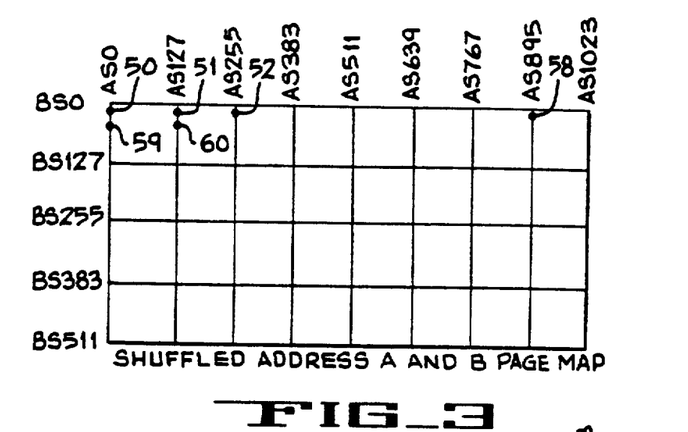
FIG. 3 is a shuffled address page map that is useful in understanding the invention.

However, address shuffler 14 changes the relative order of the conductors carrying the data store 12 address so that the 128 defective word locations do not all map into the same A group page as received by address translator 16. It will be appreciated that the defective word locations still appear along the same word line 928 in data store 12, but now map into different locations in the shuffled address A and B page map as shown in FIG. 3 so that all of the defective address locations do not map into the same A page partial address line. Since the A and B page partial addresses as used by address translator 16 merely represent a convenient partitioning of the input addresses, the address bit lines can be grouped in any desired order and need not conform to the physical decoding implemented by data store 12. In the present example physical word line 928 in data store 12 is defined by input address bits A11-A0 equal binary 001110100000. Input address bits A18-12 (BI8-2) can vary between 0 and 127 to define the different 128 words along data store physical word line 928. With input address lines A9-5 (AI9-5) exchanged with input address lines A14-10 (BI4-0) as shown in FIG. 1 by address shuffler 14, the weighted order becomes B8-B5, A9-A5, B4-B0, A4-A0. The first defective word location along physical word line 928 maps into location AS0, BS29 as represented by point 50 on the shuffled address A and B page map shown in FIG. 3. The next defective location maps into A address AS128 and B address BS29 as shown at point 51. The third defective storage location maps into A page address AS256 and B page address BS29 as shown by point 52.

It will be observed that the eighth defective word location (B4, B3, B2=1, 1, 1) along physical data store 12 word line 928 maps in the shuffled address A and B page map shown in FIG. 3 into A page address AS896 and B page address BS29 as represented by point 58. After eight defective word locations have been mapped onto B page address BS29, the B page address is incremented by 32 and the A page address is returned to 0 to map the ninth defective word location into A page address AS0 and B page address BS61 as represented by point 59. The tenth defective word location then maps into A page address AS128 and B page address BS61 as represented by point 60. The pattern then continues with 16 defective word locations being mapped into each of the A page partial address lines AS0, AS128, AS256, AS384, AS512, AS640, AS768, and AS896. At the same time, eight defective word locations are mapped into each of the B page partial address lines BS29, BS61, BS93, BS125, BS157, BS189, BS221, BS253, BS285, BS317, BS349, BS381, BS413, BS445, BS477, and BS509. As a result of the address shuffling, the nonrandom 128 defective word locations which result from defective word line 928 within data store 12 are distributed in such a way that no single A page within address translator 16 has more than 16 defective word locations assigned thereto and no single B page within address translator 16 has more than 8 defective word locations assigned thereto. This is well within the maximum of 64 which is permitted by the particular example.

It will be appreciated that as the address translator 16 is programmed to recognize and translate defective addresses, the program responds in exactly the same way as it did when there was no address shuffling except that the program will respond to the shuffled address BS8-0 and AS9-0 while the data store 12 is tested using the input or first set address A18-0. That is, as data store 12 is addressed at location 928 and the first fault along word line 928 is tested, the fault indication will be generated but address translator 16 will view this fault as occurring on shuffled address 29,696 which corresponds to the intersection of A map address AS0 and B map address BS29 in the shuffled address A and B page map of FIG. 3. Then, during subsequent operation, as input address 928 is received on input address lines A0-18, address translator 10 will be experiencing the corresponding shuffled address 29,697 on shuffled address lines AS0-9 and BS0-8 and will recognize shuffled address 24,696 as a fault location, generate the fault signal at compare circuit 32 and cause the selection of a valid data storage location within the 4K auxiliary portion of data store 12.

Figure 4:
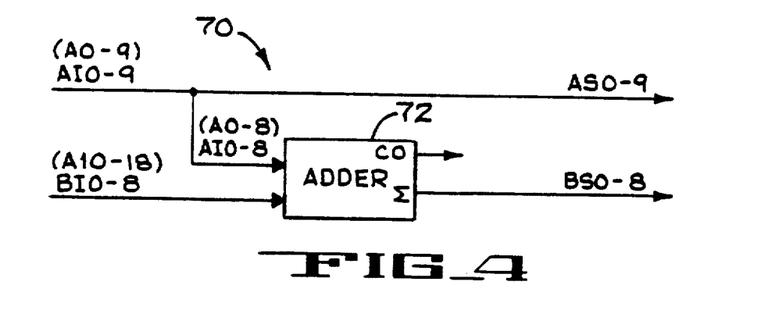
FIG. 4 is a block diagram representation of an alternative embodiment of an address shuffler included in the address translation system shown in FIG. 1.

FIG. 4 illustrates an address shuffler 70 which may be used as an alternative to the address shuffler 14 shown in FIG. 1. Address shuffler 70 includes a function circuit 72 which generates a shuffled group of addresses as a selected function of two groups of digits representing input addresses. In the present example, function generator 72 comprises a 9 bit full adder 72 which generates the B page portion of the shuffled address BS8-8 as the sum of the binary value represented by input address line A18-10 an the binary value represented by input address line A8-0 which is 446 when physical word line 928 is selected. The A page portion of the shuffled address AS9-0 is generated as a straight passthrough of the input address line A9-0.

The address shuffler 70 of FIG. 4 would be ineffective in distributing the 128 defective locations which occur on physical word line 928 in data store 12 of the prior example since all of these locations would still map into A page address line 928. The FIG. 4 arrangement fails to distribute these defective word locations because it does not modify the lower order input address bits which define the defective word line within data store 12. However, the arrangement of FIG. 4 would be effective in distributing nonrandom defective word locations which might result from defective bit lines which would be selected by decoding the higher order input address bits A18-12.

Figure 5:
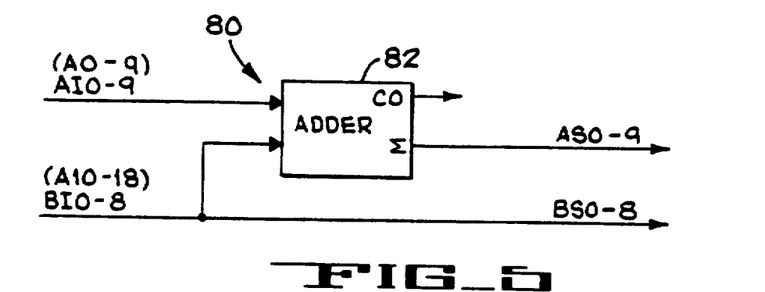
FIG. 5 is a block diagram representation of another alternative embodiment of an address shuffler included in the address translation system show in FIG. 1.

Another alternative arrangement of an address shuffler 80 shown in FIG. 5 is essentially the mirror image of address shuffler 70 shown in FIg. 4. Address shuffler 80 generates shuffled B page address bits BS0-8 as a straight passthrough of input address bits A10-18 and includes a 10 bit full adder 82 which generates the shuffled A page address bits AS9-0 as the sum of a binary value represented by input address bits A18-10 and the binary value represented by input address bits A9-0. By arbitrary choice address line A18 is aligned with address line A9 in the adder 82 and zero is provided at the input opposite address line A0.

Figure 6:
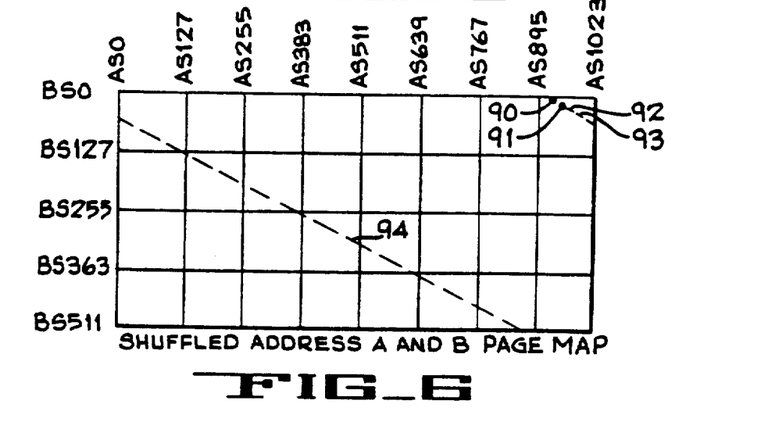
FIG. 6 is a shuffled address page map relating to the embodiment shown in FIG. 5.

The address shuffler 80 shown in FIG. 5 is very effective in distributing the defective word locations which result from the defective word line 928 in our prior example. For example, as shown in FIG. 6, the zeroth word of physical word address line 928 maps into A map address line AS928 and B map address line BS0 as represented by point 90.

The second (number 1) defective location along physical word line 928 within data store 12 has an input address of 5024. When shuffled by the address shuffler 80 shown in FIG. 5, this address maps into A map address line 936 and B map address line 4 as represented by point 91 in FIG. 6. This occurs because next adjacent words along physical word line 928 are defined by incrementing bit B2 (A12) of the B group. This results in incrementing the shuffled AS group by 8 and the shuffled BS group by 4.

The third (number 2) defective word location along word line 928 within data store 12 has input address of 9120. When shuffled by the address shuffler 80 shown in FIG. 5, this address maps into A map address line AS944 and B map address line BS8 as shown in point 92 in FIG. 6. It will thus be seen that each successive defective word location along the hypothesized defective word line 928 causes the shuffled A map address number to be incremented by 8 and the shuffled B map address number to be incremented by 4. The locus of defective word locations on the shuffled address A and B page map shown in FIG. 6 thus creates a diagonal line which will wrap around to A map address AS0 as the A address count increments to 1024. This locus of points is representatively indicated by dashed lines 93, 94.

It will thus be seen that as a result of the address shuffling provided by address shuffler 80 shown in FIG. 5, no single A page map address has more than one defective word location assigned thereto and no single B page address has more than one defective word locations assigned thereto. It will be appreciated however than in any particular instance, the distribution of assigned defective word locations will depend upon the distribution of such word locations within data store 12. The effectiveness of any particular embodiment of the address shuffler will depend upon the particular defective word location distribution for any given instance.

Figure 7:
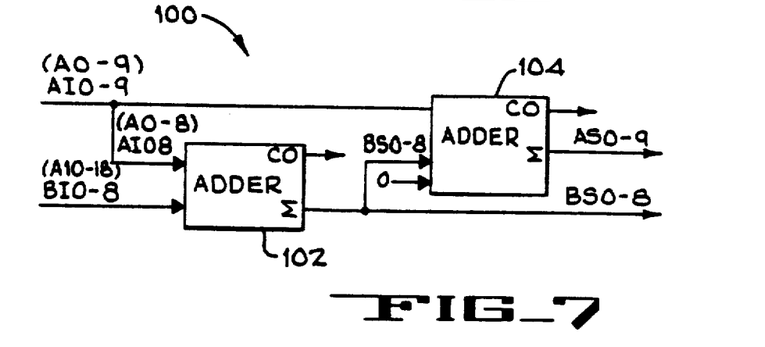
FIG. 7 is a block diagram representation of still another alternative embodiment of an address shuffler included in the address translation system shown in FIG. 1.

Still another embodiment of an address shuffler 100 which in effect combines the address shufflers illustrated in FIGS. 4 and 5 is illustrated in FIG. 7. Address shuffler 100 includes a full adder 102 which generates the 9 most significant bits of the shuffled address BS8-0 as the sum of the binary value represented by input address lines A18-10 and the binary value represented by input address lines A8-0. A full adder 104 generates the 10 least significant bits AS9-0 of the shuffled address as the sum of the 9 most significant bits of the shuffled address BS8-0 ((A18-10) with zero in the additional least significant bit position and the binary value represented by the 10 least significant input address bits A19-0 (A9-0). The address shuffler 100 shown in FIG. 7 thus provides an effective additive type shuffling of both the A page partial addresses and the B page partial addresses as seen by the address translator 16. For the arrangement of FIG. 7, the shuffled B page map addresses are the same as for the arrangement of FIG. 4 and thus the 128 defective word locations along physical word line 928 would produce B page partial addresses of 446, 450, 454, 458, 462 and so forth as in the FIG. 4 arrangement. However, the A page partial addresses now are generated as the sum of the 10 least significant bits of the input address plus the shuffled B page partial address. In the particular example, the 10 least significant bits of the input address will be the same for all defective locations along physical word line 928 and have a value of 928. The A page map address will thus increment by 8 as the B page address increments by 4 as bit B12 increments and the shuffled A group partial addresses will have the values starting with 928+832=1760. Ignoring overflows this is equivalent to 736. The zeroth word on physical word line 928 thus ocurs at AS736, BS446. Successive words cause the A group partial address to increment by 8 and the B group partial address to increment by 4. The FIG. 7 arrangement has the advantage of being capable of distributing nonrandom word location defects which may occur along bit lines defined by the higher order portions of the data store address as well as defective locations which occur along word lines defined by the lower order porton of the data store address.

It should be appreciated that functions other than addition can be utilized to shuffle the input addresses to generate the shuffled addresses as a function of two groups of digits representing input addresses. For example, in the arrangements of FIGS. 4, 5 and 7, the full adders 72, 82, 102 and 104 could be replaced with a function generator circuit having Exclusive-OR gates which receive the pairs of digit groups representing input addresses. In effect, such an arrangement would comprise half adders providing no carries between adjacent stages. Other functional relationships could be used as well so long as defects which group into a single page in the input addresses are distributed among multiple pages in the shuffled address so that no more than the maximum allowed number or defects occur on a single page.

While there have been described above several embodiments of an address translation system for the purpose of enabling a person of ordinary skill in the art to make and use the invention, it will be appreciated that the invention is not limited thereto. Accordingly, modifications, variations or equivalent arrangements within the scope of the attached claims should be considered to be within the scope of the invention.

What is claimed is:

1. An address transformation system for processing addresses for a data store having a plurality of addressable locations, some of which might be defective and some of which are nondefective, the address transformation system comprising:

an address shuffler coupled to receive a data store input address from a set of data store input addresses and output in response thereto a corresponding shuffled address from a set of shuffled addresses which is the same as the set of data store input addresses, with each shuffled address corresponding to exactly one data store input address and with a plurality of the shuffled addresses within the set of shuffled addresses each being different from its corresponding data store input address; and an address translator coupled to receive a shuffled address and output in response thereto, a corresponding valid store address from a set of valid store addresses in which each valid store address identifies a nondefective addressable location within the data store.

2. The address transformation system according to claim 1 above, wherein the address translator is further coupled to receive the data store input address and further includes a fault detector coupled to receive the shuffled address and generate a fault signal and a valid translated address identifying a nondefective addressable location if the received data store input address identifies a defective addressable location in the data store and a multiplexer coupled to output as the valid store address the translated address in the presence of the fault signal and the data store input address in the absence of the fault signal.

3. The address transformation system according to claim 1 above, wherein the address translator is responsive to a received shuffled address and includes circuitry to determine whether the received shuffled address corresponds to a data store input address which identifies a defective addressable location in the data store and to output as the valid store address a valid translated address corresponding to the received shuffled address if the shuffled address is determined to correspond to a data store input address which identifies a defective addressable location in the data store.

4. The address transformation system according to claim 1, 2 or 3 above, wherein the address shuffler is coupled to receive the data store input address as first ordered set of signals and to generate the shuffled address as a second ordered set of said signals having an order which is different from the order of the first ordered set of signals.

5. The address transformation system according to claim 1, 2 or 3 above, wherein the address shuffler receives each data store input address as an ordered set of input address signals, partitions the input address signals into at least first and second mutually exclusive ordered sets of partial input address signals and outputs the shuffled address as at least first and second ordered sets of partial shuffled address signals, the address shuffler further including an adder coupled to generate the first ordered set of partial shuffled address signals as a sum of the first and second ordered sets of partial input address signals.

6. The address transformation system according to claim 5 above, wherein the address shuffler further includes a second adder coupled to generate the second ordered set of partial shuffled address signals as a sum of the first ordered set of partial input address signals and the first ordered set of partial shuffled address signals.

7. The address transformation system according to claim 1, 2 or 3 above, wherein the address shuffler receives each data store input address represented as an ordered set of input address signals, partitions the input address signals into at least first and second mutually exclusive ordered sets of partial input address signals and outputs the shuffled address as at least first and second ordered sets of partial shuffled address signals, the address shuffler further including a function generator circuit coupled to generate the first ordered set of partial shuffled address signals with each partial shuffled address signal in the first set of partial shuffled address signals having a predetermined functional relationship to a corresponding data store input address and being different from the partial addresses in each of the first and second sets of partial input address signals which represent the data store input address corresponding to the shuffled address signal.

8. A data store address transformation system comprising:

an address translator coupled to receive a data store input address and a shuffled address having a unique correspondence to the data store input address, the address translator partitioning the received shuffled address into at least first and second partial shuffled addresses, each first and second partial shuffled address defining respectively first and second pages of shuffled addresses, the address translator including a fault-detector coupled to generate a fault signal when a received shuffled address corresponds to a data store input address which defines a defective address location within an addressable data store, the address translator including circuitry that is coupled to output the data store input address as a store address in the absence of the fault signal and to output as the store address a translated address corresponding uniquely to the received shuffled address and identifying an operative location in the addressable data store in response to the fault signal; and an address shuffler coupled to receive the data store input address and generate the shuffled address corresponding uniquely thereto, the correspondence between the shuffled address and the data store input address being such that no first page of shuffled addresses has shuffled addresses thereon which correspond to more than a first number of data store input addresses which define a defective address location in the addressable data store and no second page of shuffled addresses has shuffled addresses thereon which correspond to more than a second number of data store input addresses which define a defective address location in the addressable data store.

9. An address transformation system coupled to receive a data store input address defining an addressable location in a data store and output in response thereto a valid store address defining an operable addressable location in the data store, the address transformation system comprising:

an address translator coupled to receive a shuffled address having first and second portions and output the valid store address in response thereto, the received shuffled address being representative of a data store input address, the first and second portions of the received shuffled address each defining a page of shuffled addresses, the address translator requiring a number of defective address locations in the data store which are defined by addresses within the page of addresses defined by the first portion of the received shuffled address to be less than or equal to a first predetermined number and a number of defective address locations in the data store which are defined by addresses within the page of addresses defined by the second portion of the received shuffled address to be less than or equal to a second predetermined number; and an address shuffler coupled to receive the data store input address and in response thereto generate the shuffled address, the shuffled address having a unique correspondence and a selected relationship to the received data store input address with a number of defective addressable locations in the data store which are defined by any page of addresses defined by the first portion of the shuffled address being less than or equal to the first predetermined number and with a number of defective addressable locations in the data store which are defined by any page of addresses defined by the second portion of the shuffled address being less than or equal to the second predetermined number.

10. The address transformation system according to claim 9 above, wherein the data store input address is defined by first and second sets of ordered digits and wherein the address shuffler includes an adder coupled to generate the first portion of the shuffled address as a sum of the first and second sets of ordered digits defining the input address.

11. The address translation system according to claim 1, 8, or 9 above wherein the data store input address and the shuffled address are each represented by a plurality of ordered digits and wherein the address shuffler comprises a switching circuit coupled to switch the order of digits representing the received data store input address to generate the shuffled address.

12. The address translation system according to claim 1, 8, or 9 above, wherein the address shuffler separates the data store input address into first and second parts, generates a first part of the shuffled address as the first part of the data store input address and includes an adder coupled to generate a second part of the shuffler address as a sum of values represented by the first and second parts of the input address.

13. The address translation system according to claim 1, 8, or 9 above, wherein the address shuffler separates the data store input address into two parts and includes a first adder coupled to generate a first part of the shuffled address as a sum of values represented by the first and second parts of the data store input address and a second adder coupled to generate a second part of the shuffled address as a sum of binary values represented by the first part of the data store input address and the first part of the shuffled address.

14. An address translation system for receiving an input address from a set of input addresses and outputting in response thereto a store address identifying a nondefective data storage location within an associated data store, the system comprising:

an address shuffler coupled to receive the input address and in response thereto generate a first set address which is within a first set of addresses and a second set address which is within a second set of addresses which are shuffled relative to the first set addresses with each address in each of the first and second sets of addresses having a unique correspondence and a selected relationship to an input address and to an address within the other of the first and second sets of addresses, the addresses of the second set of addresses being partitioned into different first and second parts defining respectively a first set of pages of addresses and a second set of pages of addresses such that within the associated data store a number of defective data store address locations identified by addresses in the first set of addresses corresponding to addresses within any single page of the first set of pages is no greater than a first given number and a number of defective data store address locations identified by addresses in the first set of addresses corresponding to addresses within any single page of the second set of pages is no greater than a second given number; and an address translator coupled to receive from the address shuffler a first set address from the first set of addresses and a second set address from the second set of addresses and to output a store address in response thereto, the output store address being the received first set address in response to an absence of a fault signal and a translated address outside the first set of addresses in response to a presence of the fault signal, the address translator including a fault detector responsive to the received second set address and coupled to generate the fault signal when the received second set address corresponds to an address within a predetermined subset of the second set of addresses which each have a corresponding address from the first set of addresses which identifies a defective storage location within the associated data store.

15. An address translation system for receiving an input address from a set of input addresses and outputting in response thereto a store address identifying a nondefective data storage location within a data store, the address translation system comprising:

an address shuffler coupled to receive an input address from the set of input addresses and in response thereto to generate a first set address which is within a first set of addresses and a second set address which is within a second set of addresses with each address in each of the first and second sets having a unique correspondence and a selected relationship to an input address from the set of input addresses and to an address within the other of the first and second sets of addresses, the addresses of the second set of addresses being partitioned into different first and second parts defining respectively a first set of pages of addresses and a second set of pages of addresses such that within the data store a number of defective data store address locations defined by addresses in the first set of addresses corresponding to addresses within any single page of the first set of pages is not greater than a give number; and an address translator coupled to receive from the address shuffler a first set address and a second set address and to output a store address in response thereto, the output store address being the received first set address in response to an absence of a fault signal and a translated address outside the first set of addresses in response to a presence of the fault signal, the address translator including a fault detector responsive to the received second set address and coupled to generate the fault signal when the received second set address corresponds to an address within a predetermined subset of the second set of addresses having corresponding first set addresses which indicate a defective storage location within the data store.

16. The address translation system according to claim 14 or 15 wherein the first set address and the second set address generated by the address shuffler are each represented by a plurality of ordered digits and wherein the address shuffler comprises a switching circuit coupled to switch the order of digits representing the generated first set address to generate the generated second set address.

17. The address translation system according to claim 14 or 15 wherein the address shuffler partitions the generated first set address into first and second parts, generates the first part of the generated second set address as the first part of the generated first set address and includes an adder coupled to generate the second part of the generated second set address as a sum of values represented by the first and second parts of the generated first set address.

18. The address translation system according to claim 14 or 15 wherein the address shuffler partitions the generated first set address into first and second parts and includes a first adder coupled to generate the first part of the generated second set address as a sum of values represented by the first and second parts of the generated first set address and a second adder coupled to generate the second part of the generated second set address as a sum of values represented by the first part of the generated first set address and the first part of the generated second set address.

19. An address transformation system comprising:

an address shuffler coupled to receive an input address represented by first and second ordered sets of generated output signals in response thereto, the address shuffler comprising a function generator circuit coupled to generate the first set of output signals in response to the received first and second sets of input signals such that the first set of generated output signals is identical to neither the first nor the second set of received input signals for each possible input address; and and address translator coupled to receive the generated output address and generate a data store address in response thereto, the data store address indicating an operable storage location in a data store having a plurality of operable storage locations and a plurality of defective storage locations.

20. The address transformation system according to claim 19 above, further comprising a second function generator coupled to generate the generated second set of output signals in response to the generated first set of output signals and the received second set of input signals such that the second set of output signals is identical to neither the generated first set of output signals nor the received second set of input signals for each possible input address.

21. An address shuffler including means for receiving a data store input address from a set of data store input addresses, means for shuffling the input address in a predetermined manner to generate a shuffled address from a set of shuffled addresses which is the same as the set of input addresses with each shuffled address in the set of shuffled addresses corresponding to a different single input address in the set of input address and with a plurality of the shuffled addresses in the set of shuffled addresses each being different from the input address to which it corresponds and with the generated shuffled address being the shuffled address which corresponds to the received input address, and means for coupling the generated shuffled address to an address translator.

22. An address shuffler having an input for receiving a multidigit input address and an output providing a multidigit shuffled address having a unique one-to-one correspondence with the received input address, each digit of the received input address being represented by a corresponding input address signal and each digit of the provided output address being represented by a corresponding output address signal, the address shuffler comprising a plurality of conductors coupling a first selected plurality of the input address signals representing the received input address to the output as a first selected plurality of the shuffled address signals representing the provided shuffled address and an adder coupled to receive the first plurality of the input address signals and a second plurality of the input address signals different from the first plurality and generate as an adder output a plurality of adder output signals, each adder output signal representing a different digit of a multidigit sum of values defined by the first and second pluralities of the input address signals, said plurality of adder output signals being coupled to provide to the output of the address shuffler a second plurality of the shuffled address signals representing the provided address.

23. An address shuffler having an input for receiving a plurality of input address signals with each input address signal representing a different digit of a received multidigit input address and an output providing a plurality of shuffled address signals with each shuffled address signal representing a different digit of a multidigit shuffled address having a unique one-to-one correspondence with the received input address, the address shuffler comprising a first adder coupled to receive as inputs different first and second pluralities of the input address signals and provide as a first plurality of the shuffled address signals a plurality of signals representing different digits of a sum of values represented by the first and second pluralities of the input address signals and a second adder coupled to receive the first plurality of input address signals and the first plurality of shuffled address signals and provide as a second plurality of the shuffled address signals different from the first plurality of the shuffled address signals a plurality of signals representing different digits of a sum of values represented by the first plurality of input address signals and the first plurality of shuffled address signals.

* * * * *

UNITED STATES PATENT AND TRADEMARK OFFICE
CERTIFICATE OF CORRECTION

PATENT NO. : 4,520,453

DATED : May 28, 1985

INVENTOR(S) : Y. T. Chow

It is certified that error appears in the above-identified patent and that said Letters Patent is hereby corrected as shown below:

```
Column  3, line 45, change "show" to --shown--.
Column  4, line 35, change "AI5-18" to --A15-18--;
           line 42, change "AI0-14" to --A10-14--;
           line 45, change "AI5-18" to --A15-18--.
Column  5, line 49, change "work" to --word--.
Column  7, line 40, change "29,697" to --29,696--;
           line 53, change "BS8-8" to --BS8-0--.
Column  9, line  3, change "((A18-10" to --(A18-10)--;
           line  6, change "A19-0" to --AI9-0--;
           line 23, change "B12" to --BI2--.
Column 10, line 63, change "of partial shuffled" to --of
                    shuffled--.
Column 13, line 50, change "not" to --no--.
```

Signed and Sealed this

Twenty-seventh Day of May 1986

[SEAL]

Attest:

DONALD J. QUIGG

Attesting Officer

Commissioner of Patents and Trademarks